(12) United States Patent
Li et al.

(10) Patent No.: US 12,308,839 B2
(45) Date of Patent: May 20, 2025

(54) RC OSCILLATOR

(71) Applicant: GIGADEVICE SEMICONDUCTOR INC., Beijing (CN)

(72) Inventors: Sheji Li, Beijing (CN); Sanlin Liu, Beijing (CN)

(73) Assignee: GIGADEVICE SEMICONDUCTOR INC., Beijing (CN)

( * ) Notice: Subject to any disclaimer, the term of this patent is extended or adjusted under 35 U.S.C. 154(b) by 17 days.

(21) Appl. No.: 18/369,159

(22) Filed: Sep. 16, 2023

(65) Prior Publication Data

US 2024/0223127 A1 Jul. 4, 2024

(30) Foreign Application Priority Data

Dec. 29, 2022 (CN) .......................... 202211709872.6

(51) Int. Cl.
| | |
|---|---|
| H03K 3/0231 | (2006.01) |
| H03K 3/011 | (2006.01) |
| H03K 3/354 | (2006.01) |
| H03K 4/501 | (2006.01) |

(52) U.S. Cl.
CPC ........... *H03K 3/0231* (2013.01); *H03K 3/011* (2013.01); *H03K 3/354* (2013.01); *H03K 4/501* (2013.01)

(58) Field of Classification Search
CPC ...... H03K 3/0231; H03K 4/501; H03K 4/502; H03K 4/50; H03K 3/354; H03K 3/353; H03B 5/24
See application file for complete search history.

(56) References Cited

U.S. PATENT DOCUMENTS 6,356,161 B1 * 3/2002 Nolan .................... H03K 3/011
                                                       331/74
2009/0302954 A1  12/2009 Chen et al.
(Continued)

FOREIGN PATENT DOCUMENTS

EP          0944169 A2      9/1999

OTHER PUBLICATIONS

Soldera, Jefferson DB, Michael Todd Berens, and Alfredo Olmos. "A temperature compensated CMOS relaxation oscillator for low power applications." 2012 25th Symposium on Integrated Circuits and Systems Design (SBCCI). IEEE, 2012. (Year: 2012).*

*Primary Examiner* — Ryan Johnson
(74) *Attorney, Agent, or Firm* — IPro, PLLC (57) ABSTRACT

Disclosed is an RC oscillator comprising: a bias circuit, generating first and second bias currents, and outputting a charging current proportional to a total bias current that is the sum of the first and second bias currents, wherein the ratio of the first bias current to the second bias current has a positive temperature coefficient; and an oscillation circuit, for periodically charging a capacitor using the charging current output by the bias circuit, and using a voltage across a resistor through which the second bias current or a current proportional thereto flows as a reference voltage to compare with a charging voltage on the capacitor, so as to obtain a periodically oscillating clock signal. Thus, the present disclosure can compensate the positive temperature coefficient of the subsequent delay and realize the RC oscillator with low temperature drift by making the charging time of the capacitor have a negative temperature coefficient.

17 Claims, 5 Drawing Sheets

(56) References Cited

U.S. PATENT DOCUMENTS

| | | | |
|---|---|---|---|
| 2013/0271231 A1* | 10/2013 | Tseng | H03K 3/0231 |
| | | | 331/185 |
| 2019/0149140 A1* | 5/2019 | Han | H03K 3/011 |
| | | | 331/8 |
| 2021/0305971 A1 | 9/2021 | Wu | |

* cited by examiner

First Bias Current Module 511

FIG. 5A

First Bias Current Module 511'

FIG. 5B

Second Bias Current Module 612

FIG. 6

RC OSCILLATOR

CROSS-REFERENCE TO RELATED APPLICATIONS

This application claims priority to Chinese patent application No. 202211709872.6 filed on Dec. 29, 2022, the disclosure of which is incorporated herein by reference in its entirety and for all purposes.

TECHNICAL FIELD

The disclosure herein relates to the field of integrated circuits, and in particular, to an RC oscillator.

BACKGROUND

On-chip RC oscillators have a wide range of applications in biomedical, MCU, wireless sensing and other fields due to their advantages of low cost, low power consumption and the like. The oscillation frequency of the existing RC oscillators is related to the delay of the internal comparator and digital logic circuit. However, the delay is greatly affected by the temperature, resulting in a large difference in frequency at different temperatures, which may affect the overall function and performance of the chip.

Therefore, an RC oscillator with low temperature drift is required.

SUMMARY

According to an aspect of the present disclosure, an RC oscillator is provided, comprising: a bias circuit, configured to generate a first bias current and a second bias current, and output a charging current proportional to a total bias current that is the sum of the first bias current and the second bias current, wherein the ratio of the first bias current to the second bias current has a positive temperature coefficient; and an oscillation circuit, configured to periodically charge a capacitor using the charging current output by the bias circuit, and use a voltage across a resistor through which the second bias current or a current proportional thereto flows as a reference voltage to compare with a charging voltage on the capacitor, so as to obtain a periodically oscillating clock signal.

BRIEF DESCRIPTION OF FIGURES

The above and other objects, features and advantages of the present disclosure will become more apparent from the more detailed description of the exemplary embodiments of the present disclosure taken in conjunction with the accompanying drawings, wherein the same reference numerals generally refer to the same parts in exemplary embodiments of the present disclosure.

DETAILED DESCRIPTION

Some embodiments of the present disclosure will be described in more detail below with reference to the accompanying drawings. Although the embodiments of the present disclosure are shown in the drawings, it should be understood that the present disclosure may be embodied in various forms and should not be limited to the embodiments set forth herein. Rather, these embodiments are provided so that this disclosure will be thorough and complete, and will fully convey the scope of the disclosure to those skilled in the art.

Figure 1:
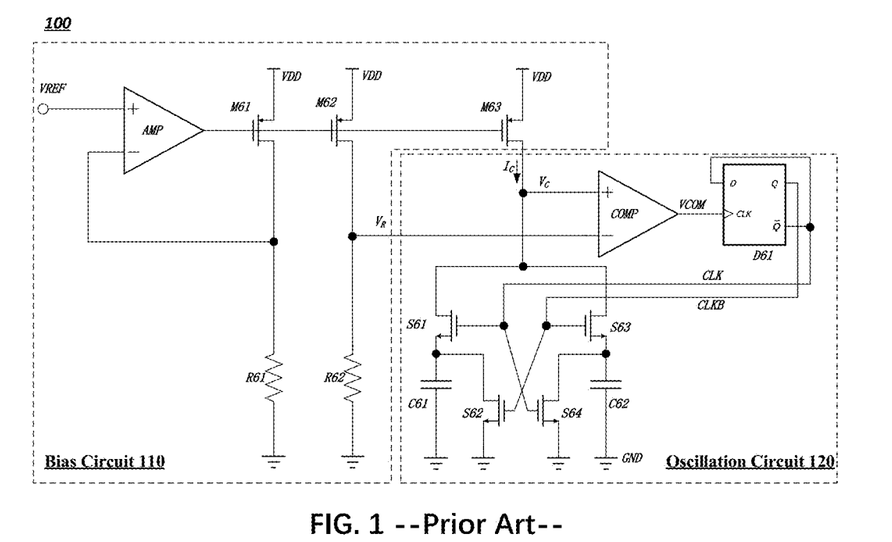
FIG. 1 shows a schematic diagram of the composition of a typical RC oscillator.

FIG. 1 shows a schematic diagram of the composition of a typical RC oscillator.

As shown in FIG. 1, the RC oscillator 100 includes a bias circuit 110 and an oscillation circuit 120, wherein the bias circuit 110 provides the oscillation circuit 120 with a charging current $I_C$ for charging the capacitor and a reference voltage $V_R$ as a comparison reference, and the oscillation circuit 120 uses the clock signal and its inverse signal to control the periodic charging and discharging of the capacitor, compares the charging voltage on the capacitor with the reference voltage $V_R$, and shapes the periodic oscillating signal which is the comparison result, so as to obtain the clock signal CLK with proper waveform and duty cycle.

Specifically, the bias circuit 110 includes an amplifier AMP, resistors R61, R62, and PMOS transistors M61, M62, M63. The operating way of the bias circuit 110 is: using the reference voltage VREF to generate a bias current=VREF/$R_1$ on the resistor R61 (where $R_1$ is the resistance value of R61), using the PMOS current mirror composed of transistors M61/M62 to replicate the bias current so as to flow through the resistor R62, thereby generating a reference voltage $V_R$=VREF*$R_2$/$R_1$ (where $R_2$ is the resistance value of R62) across the resistor R62, and using the PMOS current mirror consisting of transistors M61/M63 to replicate the bias current as a charging current $I_C$ which is supplied to the oscillation circuit 120. Thus $I_C$=VREF/$R_1$.

The oscillation circuit 120 includes capacitors C61, C62, switches S61, S62, S63, S64, a comparator COMP and a D flip-flop D61. The capacitors C61 and C62 have the same capacitance value C, and the switches S61-S64 are all NMOS transistors. The switches S61 and S63 are respectively connected between the terminal of the aforementioned current mirror outputting the charging current $I_C$ and the capacitor C61 or C62, and the switches S62 and S64 are respectively connected in parallel with the capacitor C61 or C62. The clock signal CLK outputted by the D flip-flop is connected to the control terminals of the switches S61 and S64, and the inverted clock signal CLKB outputted by the D flip-flop is connected to the control terminals of the switches S62 and S63. Therefore, the clock signal CLK and its inverted signal CLKB can control the switches S61, S64 and switches S62, S63 to be turned on and off alternately, thereby controlling the capacitors C61 and C62 to be charged and discharged alternately. The comparator COMP compares the charging voltage $V_C$ on the capacitor C61 or C62 with the reference voltage $V_R$ provided by the bias circuit 110, and outputs a comparison signal VCOM as a comparison result to the clock input terminal of the D flip-flop D61. The inverted output terminal $\overline{Q}$ of the D flip-flop D61 is connected to the data input terminal D, such that the output signal CLK and its inverted signal CLKB are flipped at the rising edge of the clock input signal (i.e., the comparison signal VCOM).

Figure 2:
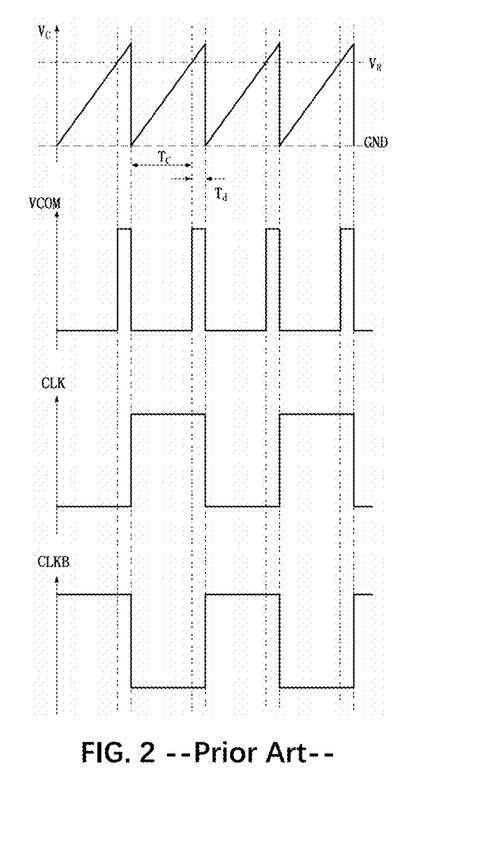
FIG. 2 shows some waveform examples of voltages and signals in a typical RC oscillator.

FIG. 2 shows the waveform examples of some key voltages and signals in this typical RC oscillator 100.

The operating process of the oscillation circuit 120 will be described below with reference to FIG. 1 and FIG. 2.

When the output CLK of the D flip-flop D61 is at low level and the inverted output CLKB is at high level, the switches S61 and S64 are turned off, and the switches S62 and S63 are turned on. The capacitor C61 is pulled down (discharged) to the ground potential GND, and the charging current $I_C$ charges the capacitor C62. At this time, $V_C$ is equal to the charging voltage on the capacitor C62, that is, the ramp signal of $V_C$ shown in FIG. 2, and its slope is $I_C/C$. As shown in FIG. 2, the charging voltage $V_C$ on the capacitor C62 exceeds the reference voltage $V_R$ after the time $T_C$ has elapsed. Therefore, the comparison signal VCOM outputted by the comparator COMP becomes high level, so that the output CLK of the D flip-flop D61 and the inverted output CLKB all flip, that is, CLK becomes high level, and CLKB becomes low level. At this time, the switches S61 and S64 are turned on, and the switches S62 and S63 are turned off. $V_C$ is pulled down to the initial voltage GND of the capacitor C61 at this time, and the charging current $I_C$ starts to charge the capacitor C61. The output VCOM of the comparator COMP becomes low level, and then becomes high level again when the charging voltage $V_C$ on the capacitor C61 exceeds the reference voltage $V_R$ after the time $T_C$ passes again, and the outputs of the D flip-flop D61 flips again, that is, CLK becomes low level, CLKB becomes high level. Then the oscillation circuit 120 repeats the above process continuously.

Please note that, as shown in FIG. 2, after the charging voltage $V_C$ exceeds the reference voltage $V_R$, due to the total delay $T_d$ existing in the following comparator COMP, D flip-flop D61 and switches S61-S64, etc., after the total delay $T_d$, flipping all the above signals and discharging the capacitor are completed, and the charging period of the capacitor is restarted. That is, the oscillation period is $2(T_C+T_d)$.

As shown in FIG. 2, $T_C$ is equal to $V_R$ divided by the slope $I_C/C$, and as mentioned earlier, $V_R=VREF*R_2/R_1$, $I_C=VREF/R_1$, from which $T_C=R_2C$ can be deduced.

Therefore, the expression of the oscillation frequency (also can be said to be the clock frequency of the output clock signal) is $$f = \frac{1}{2R_2C + 2T_d} \quad (1)$$

It can be seen from the formula (1) that, the clock frequency is not only related to the time constant $R_2C$, but also related to the total logic delay $T_d$ of the comparator, the D flip-flop and the switches. However, $T_d$ is usually very sensitive to temperature, and as the temperature rises, $T_d$ becomes larger and the clock frequency decreases. That is to say, the total logic delay $T_d$ has a positive temperature coefficient, so that the clock frequency exhibits a large temperature dependence in the entire temperature range.

In view of this, the present disclosure proposes an improved RC oscillator, which makes the charging time $T_C$ of the capacitor have a suitable negative temperature coefficient by properly setting two bias currents, thereby compensating for the positive temperature coefficient of the total logic delay $T_d$, reducing the temperature sensitivity of the clock frequency.

Specifically, the bias circuit of the RC oscillator according to the present disclosure may generate two different bias currents (such as $I_a$, $I_b$ described later), and output a current proportional to the sum of the two bias currents as the charging current of the capacitor in the oscillation circuit. Furthermore, the oscillation circuit according to the disclosure may use the voltage across the resistor through which one ($I_b$) of the two bias currents or a current proportional thereto flows, as a reference voltage for comparison with the charging voltage on the capacitor. According to the previous discussion, it can be known that, the charging time $T_C$ of the capacitor is equal to the comparison reference voltage divided by the rising slope of the charging voltage, and the slope is the ratio of the charging current to the capacitance value, thus it can be deduced that, the $T_C$ according to the present disclosure is not only related to the product of the resistance value and the capacitance value, but also is inversely proportional to the ratio ($I_a/I_b$) of the two bias currents generated by the bias circuit (see formula (11) below). Therefore, the present disclosure compensates the positive temperature coefficient of the logic delay $T_d$ of the subsequent circuits, by setting the ratio of the two bias currents to have a positive temperature coefficient such that the charging time $T_C$ of the capacitor has a negative temperature coefficient, for example, by properly adjusting the circuit parameters so as to implement the ratio ($I_a/I_b$) of the two bias currents to compensate for the positive temperature coefficient of $T_d$ and reduce the temperature sensitivity of the clock frequency.

Some exemplary embodiments of the present disclosure will be described below with reference to the accompanying drawings.

Figure 3A:
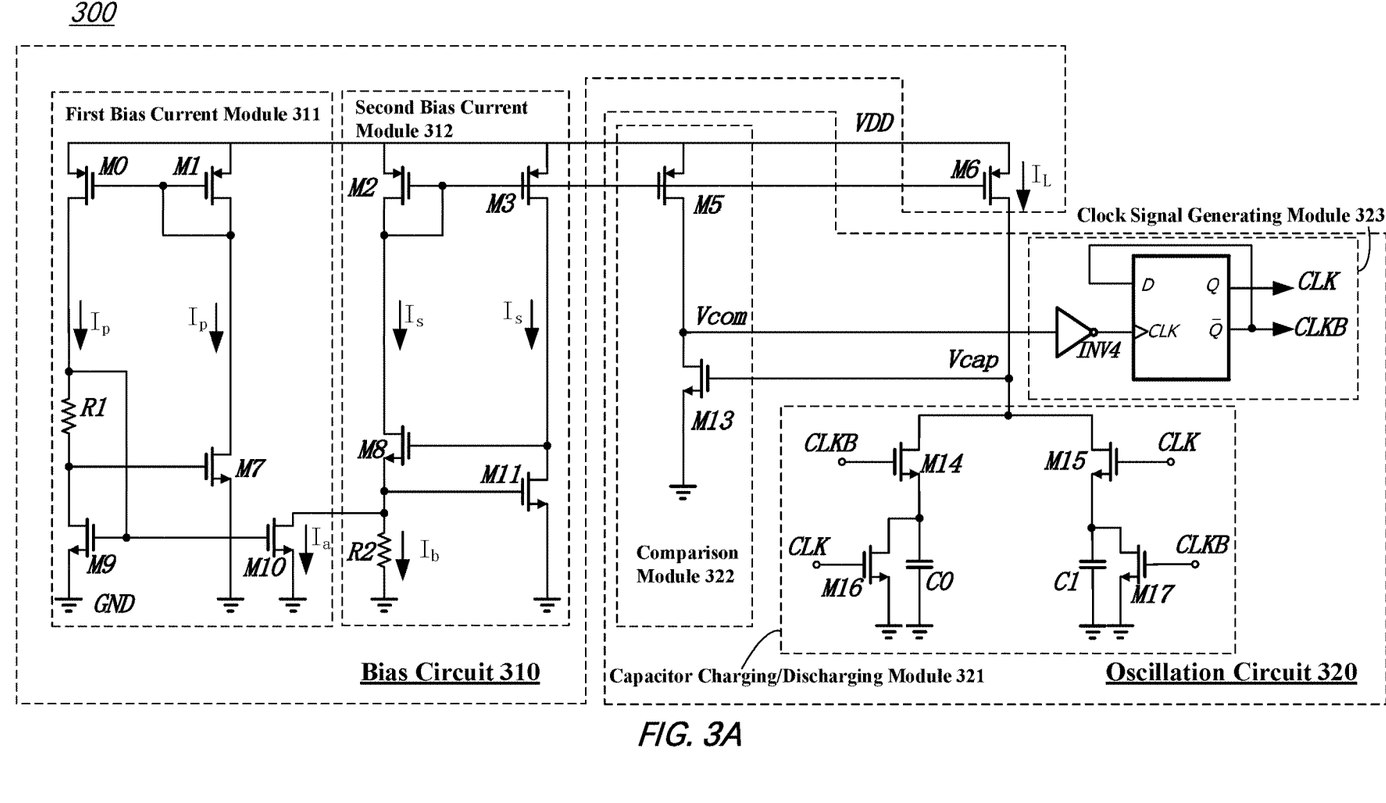
FIG. 3A and FIG. 3B respectively show schematic diagrams of the composition of an RC oscillator according to some embodiments of the present disclosure.
Figure 3B:
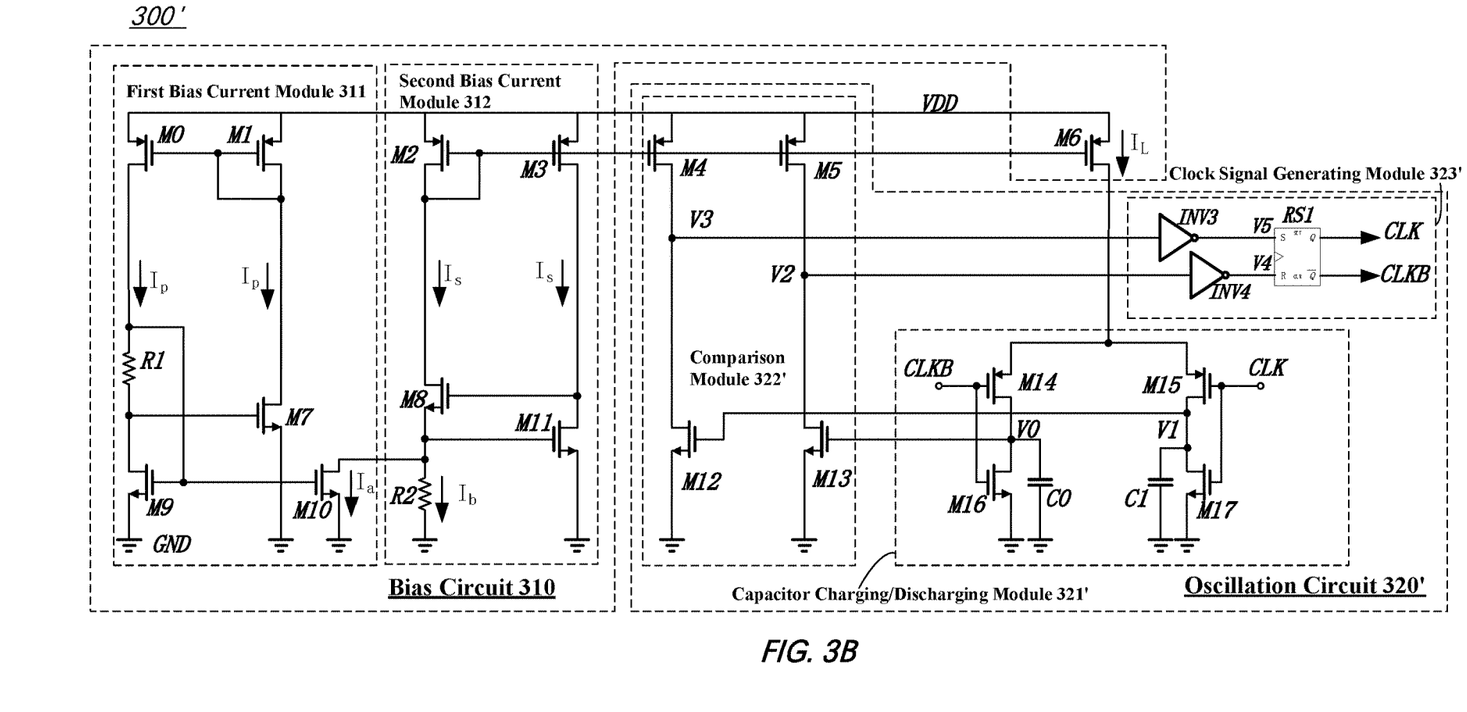

FIG. 3A and FIG. 3B respectively show schematic diagrams of the composition of an RC oscillator according to some embodiments of the present disclosure. As shown in FIG. 3A and FIG. 3B, the RC oscillator 300 or 300' includes a bias circuit 310 and an oscillation circuit 320 or 320', respectively. The difference between FIG. 3A and FIG. 3B lies in the implementation of the oscillation circuit, but the bias circuit 310 in the two is the same. The following describes the bias circuit 310 by taking FIG. 3A as an example.

The bias circuit 310 generates a first bias current $I_a$ and a second bias current $I_b$, and outputs a charging current $I_L$ proportional (N times) to the total bias current $I_s$ (=$I_a+I_b$), wherein, as will be described later in detail, $I_a/I_b$ has a positive temperature coefficient.

In some embodiments, the bias circuit 310 may include a first bias current module and a second bias current module for generating two different bias currents. For example, a first bias current with a positive temperature coefficient and a second bias current with a negative temperature coefficient may be generated such that the ratio of the first bias current to the second bias current has a positive temperature coefficient.

In some embodiments, the first bias current module may use a difference between gate-source voltages of two transistors to generate a bias current on a first bias resistor. The second bias current module may use a gate-source voltage of one transistor to generate another bias current on a second bias resistor.

Another current addition module may be used to add the two bias currents to obtain the total bias current; or alternatively, as shown in FIG. 3A, the bias current $I_a$ generated by the first bias current module 311 may be outputted to the second bias current module 312 which also has a current addition function and adds the first bias current $I_a$ and the second bias current $I_b$ to generate the total bias current $I_s$.

In some embodiments, the first bias current module may include: a first current mirror, as well as a first bias resistor, a first transistor and a second transistor all coupled to the first current mirror. The channel type of the first transistor and the second transistor is opposite to that of the transistors of the first current mirror, and the voltage across the first bias resistor is equal to the difference between the gate-source voltages of the first transistor and the second transistor, so as to generate a third bias current on the first bias resistor. The first bias current module may further include a third transistor, configured to form a second current mirror with the transistor in the first current mirror, the first transistor, or the second transistor, so as to output a current proportional to the third bias current as the first bias current. For example, the first current mirror or the second current mirror may be a NMOS current mirror or a PMOS current mirror. For example, the first current mirror or the second current mirror may be a cascode current mirror or other suitable current mirror.

In some embodiments, the second bias current module may include: a third current mirror, and a second bias resistor and a fourth transistor respectively coupled to two branches of the third current mirror. The channel type of the fourth transistor is opposite to that of the transistors of the third current mirror, and the voltage across the second bias resistor is equal to the gate-source voltage of the fourth transistor, thereby generating the second bias current on the second bias resistor. In addition, in some embodiments, the transistor outputting the first bias current in the first bias current module may also be coupled in parallel with the above-mentioned second bias resistor to a branch of the third current mirror such that the fourth transistor coupled to the other branch of the third current mirror generates the total bias current. That is, the second bias current module also has the function of current addition. For example, the third current mirror may be an NMOS current mirror or a PMOS current mirror. For example, the third current mirror may be a cascode current mirror or other suitable current mirror.

Certainly, those skilled in the art understand that, the bias circuit of the present disclosure is not limited to the above-mentioned bias current generation method, and the first bias current module and the second bias current module are not limited to the circuit structure shown in FIG. 3A, either. Rather, variations thereof are included, such as the structures shown in subsequent FIGS. 5A-5B and 6.

The operation of the bias circuit 310 according to the present disclosure will be described in detail below by taking the circuit structure of FIG. 3A as an example.

The first bias current module 311 includes PMOS transistors M0 and M1 constituting a current mirror, as well as NMOS transistors M7, M9 and a bias resistor R1 coupled to two branches of the current mirror. The sources of the NMOS transistors M7 and M9 are both grounded, and their gates are respectively connected to the two ends of the bias resistor R1. That is to say, the current $I_p$ flowing through the bias resistor R1 is equal to the ratio of the difference between gate-source voltages of the NMOS transistors M9 and M7 to the resistance value R1 of the resistor R1. Equal currents $I_p$ respectively flow through the two branches of the current mirror M0/M1, that is, the current $I_p$ is also the drain current of the NMOS transistors M7 and M9, from which it can be deduced that:

$$I_p = \frac{2}{\mu_n C_{ox}\left(\frac{W}{L}\right)_9} * \frac{1}{R_S^2}\left(1 - \frac{1}{\sqrt{K}}\right)^2 \quad (2)$$

where, $\mu_n$ is the electron mobility, $C_{ox}$ is the capacitance value of the gate oxide layer per unit area, K is the ratio of the width-to-length ratios of the transistor M7 and the transistor M9, that is, $K=(W/L)_7/(W/L)_9$. $\mu_n$ has a negative temperature coefficient, the capacitance value is slightly affected by temperature, and the bias resistor R1 may be composed of two resistors with opposite temperature coefficients such that the temperature coefficient of its total resistance value $R_S$ is close to 0 (that is, the resistance value $R_S$ of the bias resistor R1 does not change with temperature), thus the bias current $I_p$ has a positive temperature coefficient.

The first bias current module 311 also includes an NMOS transistor M10 forming a current mirror with the transistor M9, which replicates the bias current $I_p$ at a certain ratio M, so as to obtain the first bias current $I_a$ as follows:

$$I_a = \frac{2}{\mu_n C_{ox}\left(\frac{W}{L}\right)_9} * \frac{M}{R_S^2}\left(1 - \frac{1}{\sqrt{K}}\right)^2 \quad (3)$$

Since the bias current $I_p$ has a positive temperature coefficient, the first bias current $I_a$ also has a positive temperature coefficient.

As shown in FIG. 3A, the second bias current module 312 includes PMOS transistors M2 and M3 constituting a current mirror, and a bias resistor R2 and an NMOS transistor M11 respectively coupled to two branches of the PMOS current mirror. The source of the NMOS transistor M11 is grounded, its gate is coupled to one end of the bias resistor R2, and the other end of the bias resistor R2 is grounded. Therefore, the gate-source voltage $V_{GS11}$ of the NMOS transistor M11 is equal to the voltage across the bias resistor R2, in other words, the gate-source voltage of the NMOS transistor M11 generates the following second bias current $I_b$ on the bias resistor R2:

$$I_b = \frac{V_{GS11}}{R} \quad (4)$$

where R is the resistance value of the bias resistor R2. Similar to the aforementioned bias resistor R1, the bias resistor R2 may also be composed of two resistors with opposite temperature coefficients, such that the temperature coefficient of the resistance value R is close to 0 (that is, the resistance value R of the bias resistor R2 does not change with temperature). Thus the temperature coefficient of $I_b$ is determined by $V_{GS11}$ which usually has a negative temperature coefficient.

In combination with the foregoing, the first bias current $I_a$ has a positive temperature coefficient, and the second bias current $I_b$ has a negative temperature coefficient. Combining with the derivation of formulas (12) to (15) below, it can be known that, the ratio $I_a/I_b$ of the first bias current $I_a$ to the second bias current $I_b$ also has a positive temperature coefficient.

The second bias current module 312 in FIG. 3A also includes an NMOS transistor M8, which is provided for the normal operation of the bias circuit.

In addition, the second bias current module 312 also has a current addition function, wherein the bias resistor R2 and the transistor M10 outputting the first bias current $I_a$ in the first bias current module 311 are coupled in parallel to a branch of the current mirror, such that the branch current of the current mirror is the total bias current $I_s$ as the sum of the two bias currents as follows:

$$I_s = I_a + I_b \quad (5)$$

The current mirror replicates this total bias current $I_s$ to the other branch, so the drain current of transistor M11 is also $I_s$, thus:

$$I_s = \frac{1}{2}\mu_n C_{ox}\left(\frac{W}{L}\right)_{11}(V_{GS11} - V_{TH})^2 \quad (6)$$

Wherein, $(W/L)_{11}$ is the width-to-length ratio of the transistor M11, and $V_{TH}$ is the threshold voltage of the transistor M11.

In addition, the bias circuit 310 also includes a PMOS transistor M6 that forms a current mirror with the transistors in the current mirror in the second bias current module 312, which replicates the total bias current at a certain ratio N, and thus the charging current of the capacitor is obtained as follows:

$$I_L = N * I_s \quad (7)$$

The oscillation circuit will be discussed below taking FIG. 3A and FIG. 3B as examples respectively.

In some embodiments, the oscillation circuit includes a capacitor charging/discharging module, a comparing module and a clock signal generating module, such as those shown in FIG. 3A and FIG. 3B.

The capacitor charging/discharging module is configured to use a clock signal to control the on-off of the switch coupled to the capacitor, so as to alternately discharge the capacitor to the ground potential and charge the capacitor with the charging current $I_L$ provided by the bias circuit. In some embodiments, the capacitor charging/discharging module 321 as shown in FIG. 3A (which is the same as the structure of the two capacitors S62 and S64 and their control switches S61-S64 used in the aforementioned FIG. 1), or the capacitor charging/discharging module 321' as shown in FIG. 3B may be adopted, which both can control two symmetrical capacitors to charge and discharge alternately. Of course, those skilled in the art can understand that, only one capacitor and its control switches may be used as required, to realize the function of the capacitor charging/discharging module.

The comparison module is configured to compare the charging voltage on the capacitor in the capacitor charging/discharging module with the reference voltage provided by the bias circuit, so as to output a comparison signal as a comparison result. In some embodiments, the comparison module may include at least one current comparator, which uses the total bias current generated by the bias circuit as the bias current. For example, the comparison module 322 in FIG. 3A includes one current comparator, while the comparison module 322' in FIG. 3B includes two current comparators which both use the total bias current $I_s$ as the bias current, so that the flipping voltages of these comparators both are equal to the gate-source voltage $V_{GS11}$ of the NMOS transistor M11, that is, the voltage across the second bias resistor R2. In some embodiments, a voltage comparator COMP as shown in FIG. 1 may be adopted to implement the comparison function. Of course, those skilled in the art can understand that one or two comparators can be set as required to realize the comparison function.

The clock signal generation module is configured to shape the comparison signal output by the comparison module into a clock signal. In some embodiments, the clock signal generation module 323 (including an inverter for inverting the comparison signal and a D flip-flop) as shown in FIG. 3A may be used to implement the shaping function to obtain a clock signal with a suitable waveform and duty cycle. In some embodiments, the clock signal generating module 323' (including two inverters and a RS flip-flop) as shown in FIG. 3B, or the D flip-flop D61 as shown in FIG. 1 may be used to realize the shaping function to obtain a clock signal with a suitable waveform and duty cycle. Of course, those skilled in the art can understand that any other suitable shaping circuit can be used as required to realize the shaping function.

The operation of the oscillation circuit 320 according to the present disclosure will be described in detail below by taking the circuit structure of FIG. 3A as an example.

As shown in FIG. 3A, the oscillation circuit 320 includes a capacitor charging/discharging module 321, a comparing module 322 and a clock signal generating module 323.

The capacitor charging/discharging module 321 includes a first capacitor C0 and a second capacitor C1, and switches M14-M17 respectively coupled to the capacitors C0 and C1. Capacitors C0 and C1 have the same capacitance value and are matched (i.e., have the same design, such as structure, size, etc.). Here the switches M14-M17 are all NMOS transistors. The gate terminals of the transistors M14-M17 are respectively connected to the subsequently generated non-overlapping clock signal CLK and its inverted signal CLKB, so that turning on or off of each switch is controlled by the clock signal CLK or its inverted signal CLKB. Specifically, when the clock signal CLK is at a low level, the switch M14 coupled between the first capacitor C0 and the drain of the transistor M6 and the switch M17 connected in parallel with the second capacitor C1 are turned on, and the switch M15 coupled between the second capacitor C1 and the drain of the transistor M6 and the switch M16 connected in parallel with the first capacitor C0 are turned off, so that the first capacitor C0 is charged by the charging current $I_L$ and the second capacitor C1 is discharged to ground level. On the contrary, when the clock signal CLK is at a high level, the switches M14 and M17 are turned off, and the switches M15 and M16 are turned on, so that the first capacitor C0 is discharged to the ground level and the second capacitor C1 is charged by the charging current $I_L$. In fact, the capacitor charging/discharging module 321 in FIG. 3A has the same structure as the aforementioned two capacitors S62 and S64 and their control switches S61-S64 used in the FIG. 1, whose operating process in details may refer to the previous FIGS. 1-2 and related descriptions.

The comparison module 322 includes a comparator (also called an inverter) composed of a PMOS transistor M5 and an NMOS transistor M13. The PMOS transistor M5 and the PMOS transistor M2 form a current mirror, so as to output the total bias current $I_s$ as the bias current of the comparator, and the flipping voltage of the comparator is equal to the gate-source voltage $V_{GS11}$ of the NMOS transistor M11. The NMOS transistor M13 is matched with the NMOS transistor M11, its drain is coupled to the drain of the transistor M5, its source is grounded, and its gate is coupled to the charging voltage Vcap on the capacitor (which is also the drain of the PMOS transistor M6), thereby outputting the comparison signal Vcom from the drain of the NMOS transistor M13.

The comparator may be regarded as a current comparator, which compares the bias current (that is, the total bias current $I_s$) with the drain current of the transistor M13. The output Vcom is high when the drain current of the transistor M13 is less than the bias current, and the output toggles when the two are equal. The ratio of the width-to-length ratios of the PMOS transistors M5 and M2 are 1:1 and the two PMOS transistors are matched, and the ratio of the width-to-length ratios of the NMOS transistors M13 and M11 are also 1:1 and the two NMOS transistors are matched. The bias current (i.e., the total bias current $I_s$) is equal to the drain current of the transistor M11, therefore, the comparison between the drain current of the transistor M13 and the bias current is equivalent to the comparison between the gate-source voltage (that is, the charging voltage Vcap) of the transistor M13 and the gate-source voltage $V_{GS11}$ of the transistor M11 after the bias circuit 310 works stably. In other words, the comparator compares the gate-source voltage $V_{GS11}$ (=$I_b$*R, as mentioned above) of the transistor M11 as a reference voltage with the charging voltage Vcap on the capacitor, thereby outputting a comparison signal Vcom.

The clock signal generation module 323 includes an inverter INV4 and a D flip-flop. The inverter INV4 inverts the comparison signal Vcom output by the comparison module 322 so as to invert the negative pulse of Vcom into a positive pulse. The waveform of Vcom after passing through the inverter INV4 is the same as that of VCOM in FIG. 2, and the operation of the subsequent D flip-flop is also the same as that in FIG. 1 and FIG. 2. Similar to FIG. 1, the data input terminal of the D flip-flop is coupled to its inverting output terminal, the clock input terminal of the D flip-flop is coupled to the output terminal of the inverter, and the output terminals of the D flip-flop respectively output clock signals CLK and its inverted signal CLKB.

In short, the oscillation circuit 320 of FIG. 3A has a structure similar to that of FIG. 1 above, except that the voltage comparator is replaced by a current comparator and its subsequent inverter. Therefore, the operating principle and process of the oscillation circuit 320 of FIG. 3A is similar to that described above in conjunction with FIG. 1 and FIG. 2, and will not be repeated here.

The operation of the oscillation circuit 320' according to the present disclosure will be described in detail below by taking the circuit structure of FIG. 3B as an example.

As shown in FIG. 3B, the oscillation circuit 320' includes a capacitor charging/discharging module 321', a comparing module 322' and a clock signal generating module 3231.

The capacitor charging/discharging module 321' includes a first capacitor C0 and a second capacitor C1, and switches M14-M17 respectively coupled to the capacitors C0 and C1. Capacitors C0 and C1 have the same capacitance value and are matched (i.e., have the same design, such as structure, size, etc.). Here switches M14 and M15 are PMOS transistors, and M16 and M17 are NMOS transistors. The gate terminals of the transistors M14-M17 are respectively connected to the subsequently generated non-overlapping clock signal CLK and its inverted signal CLKB, so that turning on or off of each switch is controlled by the clock signal CLK or its inverted signal CLKB. Specifically, when the clock signal CLK is at a high level, the switch M14 coupled between the first capacitor C0 and the drain of the transistor M6 and the switch M17 connected in parallel with the second capacitor C1 are turned on, and the switch M15 between the second capacitor C1 and the drain of the transistor M6 and the switch M16 connected in parallel with the first capacitor C0 are turned off, so that the first capacitor C0 is charged by the charging current $I_L$ and the second capacitor C1 is discharged to ground level. On the contrary, when the clock signal CLK is at a low level, the switches M14 and M17 are turned off, and the switches M15 and M16 are turned on, so that the first capacitor C0 is discharged to the ground level and the second capacitor C1 is charged by the charging current $I_L$.

The comparison module 322' includes a first comparator composed of a PMOS transistor M5 and an NMOS transistor M13, and a second comparator composed of a PMOS transistor M4 and an NMOS transistor M12. The PMOS transistors M4 and M5 respectively form current mirrors with the PMOS transistor M2, and both output the total bias current $I_s$ as the bias currents of the two comparators, so that the flipping voltages of the two comparators both are equal to the gate-source voltage $V_{GS11}$ of the NMOS transistor M11. The NMOS transistor M13 is matched with the NMOS transistor M11, its drain is coupled to the drain of the transistor M5, its source is grounded, and its gate is coupled to the charging voltage V0 on the first capacitor C0, thereby outputting the first comparison signal V2 from the drain of the transistor M13. The NMOS transistor M12 is matched with the NMOS transistor M11, its drain is coupled to the drain of the transistor M4, its source is grounded, and its gate is coupled to the charging voltage V1 on the second capacitor C1, thereby outputting the second comparison signal V3 from the drain of the transistor M12.

These two comparators (also called inverters) may be regarded as current comparators, which compare the bias current (that is, the total bias current $I_s$) with the drain current of the transistor M12 or M13. When the drain current of M12 or M13 is less than the bias current, the output V3 or V2 is at high level, and when the two are equal, the output flips. The ratio of the width-to-length ratios of the PMOS transistors M4, M5, and M2 are 1:1:1 and these three PMOS transistors are matched, and the ratio of the width-to-length ratios of the NMOS transistors M12, M13, and M11 are also 1:1:1 and these three NMOS transistors are matched. The bias current (that is, the total bias current $I_s$) is equal to the drain current of the transistor M11, so the comparison between the drain current of the transistor M12 or M13 and the bias current is equivalent to the comparison between the gate-source voltage (that is, the charging voltage V1 or V0) of the transistor M12 or M13 and the gate-source voltage $V_{GS11}$ of the transistor M11 after the bias circuit 310 works stably. In other words, the two comparators use the gate-source voltage $V_{GS11}$ (=$I_b$*R, as mentioned above) of the transistor M11 as a reference voltage to compare with the charging voltage V0 or V1 on one of the two capacitors, thereby outputting the comparison signal V2 or V3.

As mentioned above, the comparator structure in FIG. 3A or FIG. 3B is only an exemplary implementation, and the present disclosure is not limited thereto. For example, similar to the implementation in FIG. 1, the voltage across the bias resistor R2 may be drawn out as the comparison reference of the voltage comparator, or alternatively, the second bias current $I_b$ or a current proportional to it may be drawn out to flow through another resistor and the voltage across the another resistor may be used as the comparison reference of the voltage comparator to compare with the charging voltage on the capacitor.

The clock signal generating module 323 includes two inverters INV3 and INV4, and an RS flip-flop RS1. The two inverters INV3 and INV4 respectively invert the two comparison signals V2 and V3 output by the comparison module 322 so as to invert the negative pulses of V2 and V3 into positive pulses. The input terminals of the RS flip-flop RS1 are respectively coupled to the output terminals of the two inverters, and the RS flip-flop RS1 outputs the clock signal CLK and its inverted signal CLKB.

In short, the oscillation circuit 320 alternately charges and discharges the capacitors C0 and C1 to generate non-overlapping upward pulses at the nodes V4 and V5 respectively, so that the RS flip-flop RS1 generates a pair of non-overlapping clock signals CLK and CLKB, and the clock signals CLK and CLKB are coupled to the control terminals of the switches for controlling the charging and discharging of the capacitors C0 and C1, thereby controlling the charging and discharging of the capacitors.

Figure 4:
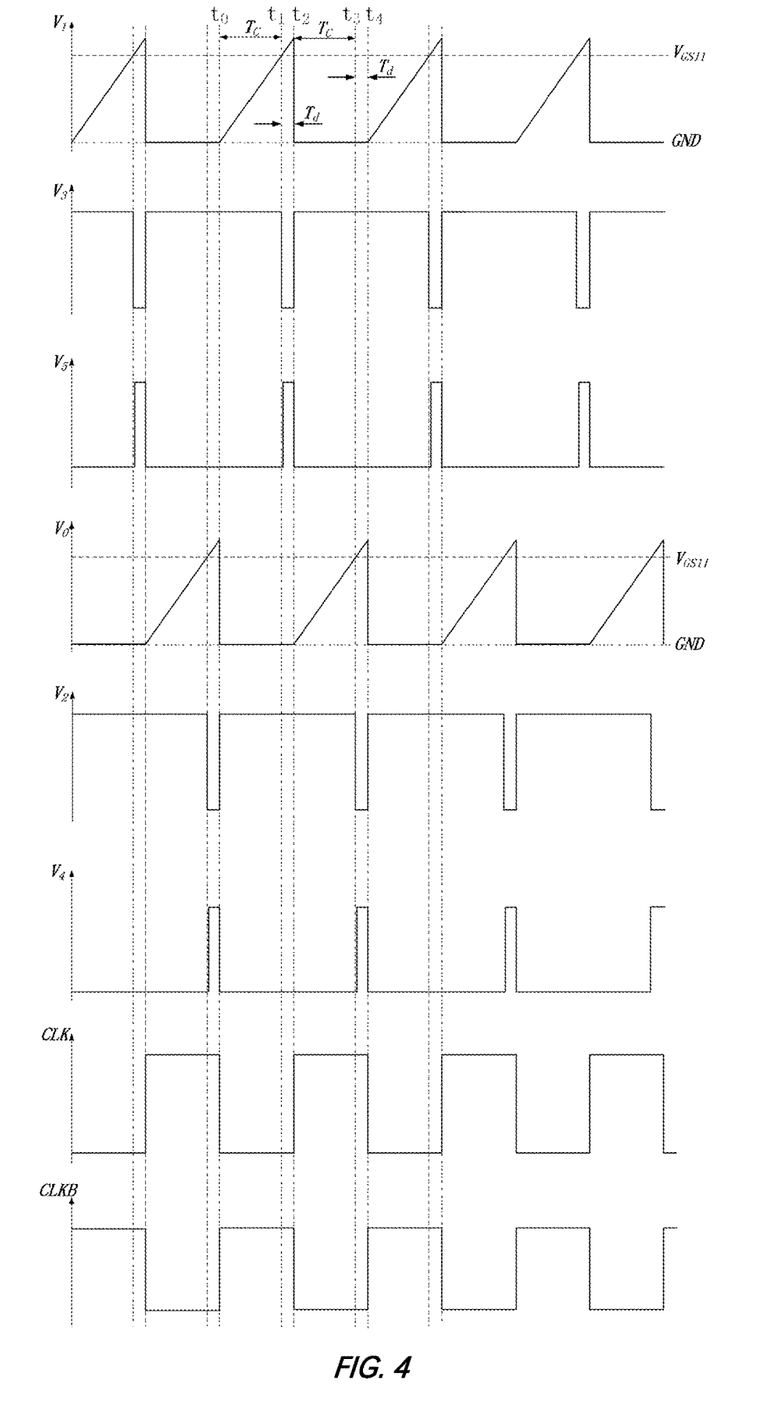
FIG. 4 shows some waveform examples of voltages and signals in an RC oscillator according to an embodiment of the present disclosure.

FIG. 4 shows an example of waveforms of some key voltages and signals in the RC oscillator 300' according to an embodiment of the present disclosure.

The working process of the oscillation circuit 320' will be described below with reference to FIG. 3B and FIG. 4.

After the entire RC oscillator 300' is powered on, the bias circuit 310 works to generate bias currents $I_a$, $I_b$, $I_s$, and output a charging current $I_L$. At time $t_0$, the outputs of the RS flip-flop RS1, i.e., CLK=0 and CLKB=1, so the switches M15 and M16 are turned on, and the switches M14 and M17 are turned off. The upper plate of the capacitor C0 is grounded, and the voltage V0 is pulled down to zero. The constant current source $I_L$ charges the capacitor C1 linearly, and the voltage V1 of the capacitor C1 increases linearly. At time $t_1$, the voltage V1 increases to the flipping voltage $V_{GS11}$ of the second comparator, and thus the output V3 of the second comparator flips. After the total logic delay $T_d$ of the second comparator, the inverter INV3, and the RS flip-flop RS1, at time $t_2$, the clock signal CLK is set to 1, and CLKB becomes 0. At this time, the switches M14 and M17 are turned on, and the switches M15 and M16 are turned off. The upper plate of the capacitor C1 is grounded, and the voltage V1 is pulled down to zero. The constant current source $I_L$ charges the capacitor C0 linearly, and the voltage V0 of the capacitor C0 increases linearly. At time $t_3$, the voltage V0 increases to the flipping voltage $V_{GS11}$ of the first comparator, and thus the output V2 of the first comparator flips. After the total logic delay $T_d$ of the first comparator, the inverter INV4, and the RS flip-flop RS1, at time $t_4$, the clock signal CLK is reset to 0, and CLKB becomes 1.

The above process from time $t_0$ to time $t_4$ constitutes an oscillation cycle of the oscillation circuit 320', and then the circuit repeats the above process continuously. Therefore, the oscillation period T is equal to twice the sum of the charging time $T_C$ of the capacitor and the delay $T_d$ of the subsequent circuits, that is:

$$T = 2(T_c + T_d) \quad (8)$$

The capacitor charging time from time $t_0$ to time $t_1$ is $$T_c = \frac{C * V_{GS11}}{I_L} \quad (9)$$

where C is the capacitance value of the capacitors C0 and C1.

Combining the previous formula (9) with the previous formulas (5) and (7), the following is deduced:

$$T_c = \frac{1}{N} * \frac{CV_{GS11}}{I_a + I_b} \quad (10)$$

Combining the previous formulas (4) and (10), the following is deduced:

$$T_c = \frac{1}{N} * \frac{RC}{1 + \frac{I_a}{I_b}} \quad (11)$$

As mentioned before, since the three parameters N, R, and C are little affected by temperature, the temperature coefficient of $T_C$ is negatively correlated with the temperature coefficient of the bias current ratio ($I_a/I_b$). Since the temperature coefficient of $I_a/I_b$ is positive, $T_C$ has a negative temperature coefficient, which can compensate the positive temperature coefficient of $T_d$, thereby reducing the temperature drift of the RC oscillator.

A more detailed reasoning process for $I_a/I_b$ having a positive temperature coefficient will be given below in conjunction with the previous discussion.

Combining the previous formulas (5) and (6), the following is deduced:

$$I_a + I_b = \frac{1}{2}\mu_n C_{ox}\left(\frac{W}{L}\right)_{11}(V_{GS11} - V_{TH})^2 \quad (12)$$

Combining the previous formulas (4) and (12), the following is deduced:

$$\frac{I_a}{I_b} = \frac{\mu_n C_{ox}\left(\frac{W}{L}\right)_{11} R^2 I_a}{1 + \mu_n C_{ox}\left(\frac{W}{L}\right)_{11} RV_{TH} + \sqrt{1 + 2\mu_n C_{ox}\left(\frac{W}{L}\right)_{11} RV_{TH} + 2\mu_n C_{ox}\left(\frac{W}{L}\right)_{11} R^2 I_a}} \quad (13)$$

Let $\alpha = \mu_n C_{ox}(W/L)_{11} R^2 I_a$, and the following is deduced:

$$\alpha = 2M * \frac{\left(\frac{W}{L}\right)_{11}}{\left(\frac{W}{L}\right)_9} * \left(\frac{R}{R_S}\right)^2 \left(1 - \frac{1}{\sqrt{K}}\right)^2 \quad (14)$$

It can be known from the formula (14) that, $\alpha$ is the product of the ratio of the width to length ratios of the transistors and the ratio of the resistance values of the resistors, so a has nothing to do with temperature.

Combining the previous formulas (13) and (14), the following is deduced:

$$\frac{I_a}{I_b} = \frac{\alpha}{1 + \mu_n C_{ox}\left(\frac{W}{L}\right)_{11} RV_{TH} + \sqrt{1 + 2\mu_n C_{ox}\left(\frac{W}{L}\right)_{11} RV_{TH} + 2\alpha}} \quad (15)$$

Since $\mu_n$ and $V_{TH}$ have negative temperature coefficients, and the resistance value and the capacitance value are little affected by temperature as mentioned above, Ia/Ib has a positive temperature coefficient. Therefore, $T_C$ has a negative temperature coefficient as mentioned earlier. By adjusting the ratio of $I_a$ and $I_b$ properly, the positive temperature coefficient of $T_d$ can be compensated, so that the oscillation frequency exhibits low temperature drift characteristics in the entire temperature range.

Figure 5A:
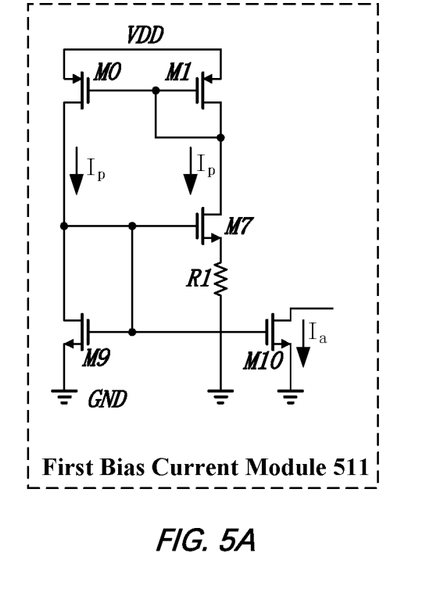
FIG. 5A and FIG. 5B respectively show schematic diagrams of the composition of a first bias current module according to some embodiments of the present disclosure.
Figure 5B:
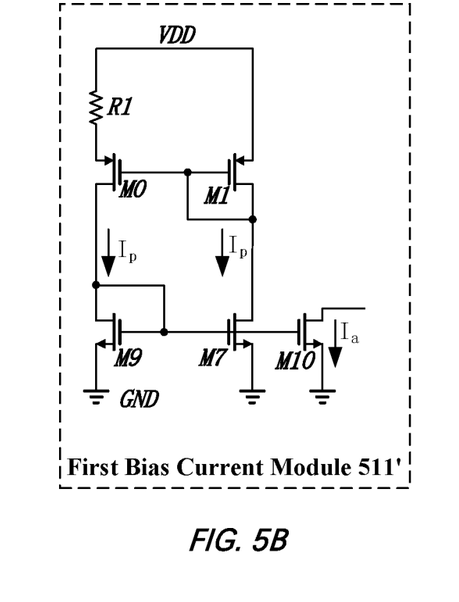

FIG. 5A and FIG. 5B respectively show composition diagrams of some alternative implementations of the first bias current module 311 in FIG. 3A according to some embodiments of the present disclosure.

The main difference between the first bias current module 511 in FIG. 5A and that in FIG. 3A is that, the bias resistor R1 is moved so as to be located between the source of the NMOS transistor M7 and the ground. However, the voltage across the bias resistor R1 is still equal to the difference between the gate-source voltages of the NMOS transistors M9 and M7. The above formula (2) still applies to the bias current $I_p$.

The main difference between the first bias current module 511' of FIG. 5B and that in FIG. 3A is that, the bias resistor R1 is moved so as to be located between the source of the PMOS transistor M0 and the power supply voltage VDD, and the NMOS transistors M9 and M7 form a current mirror, replacing the PMOS current mirror. The voltage across the bias resistor R1 is equal to the difference between the gate-source voltages of the PMOS transistors M1 and M0. The bias circuit structure of FIG. 5B (parts except M10) may be regarded as the same as that of FIG. 5A, wherein only the channel type of each transistor is changed. Therefore, the formula for deriving the bias current $I_p$ is similar to the above formula (2).

Figure 6:
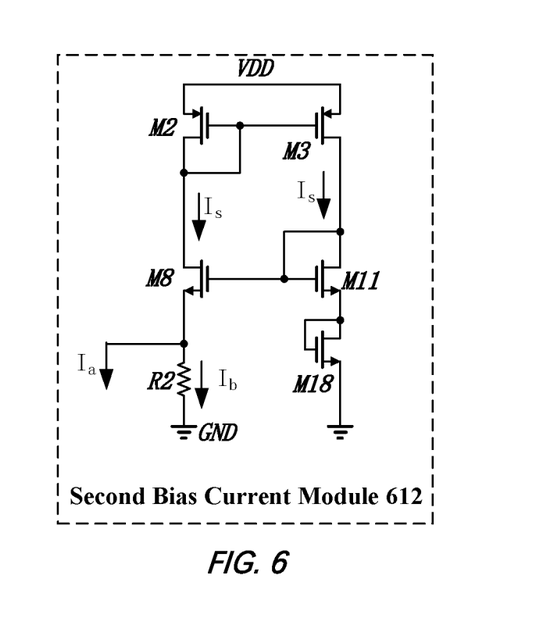
FIG. 6 shows a schematic diagram of the composition of a second bias current module according to an embodiment of the present disclosure.

FIG. 6 shows a schematic composition diagram of an alternative implementation of the second bias current module 312 in FIG. 3A according to an embodiment of the present disclosure.

The main difference between the second bias current module 612 in FIG. 6 and the second bias current module 312 in FIG. 3A is that, an NMOS transistor M18 is added between the source of the NMOS transistor M11 and the ground, the gate of the NMOS transistor M11 is connected to the gate of the NMOS transistor M8, the NMOS transistors M11 and M8 are matched (having the same width-to-length ratios), and the bias resistor R2 is connected between the source of the NMOS transistor M8 and the ground. Therefore, the voltage across the bias resistor R2 is equal to the gate-source voltage $V_{GS18}$ of the NMOS transistor M18, and the total bias current $I_s$ is the drain current of the NMOS transistor M18. In other words, the above-mentioned formulas may be amended by replacing $V_{GS11}$ with $V_{GS18}$, so as to be applied to the circuit in FIG. 6.

In addition, although not shown, in some embodiments, the PMOS current mirrors in FIGS. 3A-3B, FIGS. 5A-5B and FIG. 6 may have other circuit structures, such as cascode current mirrors and the like. In addition, in some embodiments, NMOS current mirrors can also be used instead of the respective PMOS current mirrors in FIGS. 3A-3B, FIGS. 5A-5B and FIG. 6. Those skilled in the art can understand that the above-mentioned circuit structures of the present disclosure can be appropriately modified as required, and these changes are all within the protection scope of the present disclosure.

Various embodiments of the present disclosure have been described above, and the foregoing descriptions are exemplary, not exhaustive, and not limiting of the disclosed embodiments. Numerous modifications and variations will be apparent to those of ordinary skill in the art without departing from the scope and spirit of the described embodiments. The terminology used herein was chosen to best explain the principles of the various embodiments, the practical application or improvement over the technology in the marketplace, or to enable others of ordinary skill in the art to understand the various embodiments disclosed herein.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. An RC oscillator comprising:
  a bias circuit, configured to generate a first bias current and a second bias current, and output a charging current proportional to a total bias current that is the sum of the first bias current and the second bias current, wherein the ratio of the first bias current to the second bias current has a positive temperature coefficient; and
  an oscillation circuit, configured to periodically charge a capacitor using the charging current output by the bias circuit, and use a voltage across a resistor through which the second bias current or a current proportional thereto flows as a reference voltage to compare with a charging voltage on the capacitor, so as to obtain a periodically oscillating clock signal;
  wherein, the bias circuit comprises:
  a first bias current module, comprising a first bias resistor, a first transistor and a second transistor, and configured to generate the first bias current having a positive temperature coefficient or a current proportional to the first bias current on the first bias resistor, wherein a voltage across the first bias resistor is equal to a difference between gate-source voltages of the first transistor and the second transistor, and
  a second bias current module, comprising a second bias resistor and a fourth transistor, and configured to generate the second bias current having a negative temperature coefficient or a current proportional to the second bias current on the second bias resistor, wherein a voltage across the second bias resistor is equal to a gate-source voltage of the fourth transistor;
  wherein, the first bias current module outputs the first bias current to the second bias current module, and the second bias current module adds the first bias current and the second bias current to generate the total bias current.

2. The RC oscillator according to claim 1, wherein, the first bias current module further comprises:
  a first current mirror and a third transistor,
  wherein, the first bias resistor, the first transistor and the second transistor are coupled to the first current mirror, and the first transistor and the second transistor have a channel type opposite to that of transistors of the first current mirror, and
  wherein, the third transistor forms a second current mirror with a transistor in the first current mirror, the first transistor or the second transistor,
  wherein a third bias current is generated on the first bias resistor, and the third transistor outputs a current proportional to the third bias current as the first bias current.

3. The RC oscillator according to claim 1, wherein,
the second bias current module further comprises:
a third current mirror,
wherein, the second bias resistor and the fourth transistor are respectively coupled to two branches of the third current mirror, and the fourth transistor has a channel type opposite to that of transistors of the third current mirror so as to generate the second bias current on the second bias resistor.

4. The RC oscillator according to claim 3, wherein,
the first bias current module further comprises a third transistor for outputting the first bias current,
wherein, the third transistor is coupled in parallel with the second bias resistor to one branch of the third current mirror, such that the fourth transistor coupled to the other branch of the third current mirror generates the total bias current.

5. The RC oscillator according to claim 1, wherein,
the first transistor and the second transistor are respectively a first NMOS transistor and a second NMOS transistor, and the fourth transistor is a fourth NMOS transistor,
the first bias current module further includes:
a first PMOS current mirror and a third NMOS transistor,
wherein, the first bias resistor, the first NMOS transistor and the second NMOS transistor are coupled to the first PMOS current mirror, wherein a voltage across the first bias resistor is equal to a difference between gate-source voltages of the first NMOS transistor and the second NMOS transistor, and
wherein, the third NMOS transistor forms a second current mirror with the first NMOS transistor or the second NMOS transistor,
wherein a third bias current is generated on the first bias resistor, and the third NMOS transistor outputs a current proportional to the third bias current as the first bias current; and
the second bias current module further includes:
a third PMOS current mirror,
wherein, the second bias resistor and the fourth NMOS transistor are respectively coupled to two branches of the third PMOS current mirror, wherein a voltage across the second bias resistor is equal to a gate-source voltage of the fourth NMOS transistor, so as to generate the second bias current on the second bias resistor,
wherein, the second bias resistor and the third NMOS transistor are coupled in parallel to one branch of the third PMOS current mirror, such that the fourth NMOS transistor coupled to the other branch of the third PMOS current mirror generates the total bias current; and
the bias circuit further includes a fifth PMOS transistor, for forming a fourth current mirror with a transistor in the third PMOS current mirror, and outputting the charging current proportional to the total bias current.

6. The RC oscillator according to claim 1, wherein,
the oscillation circuit comprises:
a capacitor charging/discharging module, configured to use the clock signal to control on or off of a switch coupled to the capacitor, so as to alternately discharge the capacitor to the ground potential and charge the capacitor with the charging current,
a comparison module, configured to compare a charging voltage on the capacitor with the reference voltage, so as to output a comparison signal as a comparison result, and
a clock signal generating module, configured to shape the comparison signal into the clock signal.

7. The RC oscillator according to claim 6, wherein,
the comparison module comprises:
at least one current comparator using the total bias current as a bias current.

8. The RC oscillator according to claim 5, wherein,
the oscillation circuit comprises:
a capacitor charging/discharging module, configured to use the clock signal to control on or off of a switch coupled to the capacitor, so as to alternately discharge the capacitor to the ground potential and charge the capacitor with the charging current,
a comparison module, configured to compare a charging voltage on the capacitor with the reference voltage, so as to output a comparison signal as a comparison result, and
a clock signal generating module, configured to shape the comparison signal into the clock signal.

9. The RC oscillator according to claim 8, wherein,
the comparison module comprises a comparator, wherein the comparator uses the total bias current as a bias current such that a flipping voltage of the comparator is equal to the gate-source voltage of the fourth NMOS transistor.

10. The RC oscillator according to claim 9, wherein,
the comparator comprises:
a sixth PMOS transistor, for forming a fifth current mirror with a transistor in the third PMOS current mirror, and outputting the total bias current, and
a seventh NMOS transistor matched with the fourth NMOS transistor, wherein the drain of the seventh NMOS transistor is coupled to the drain of the sixth PMOS transistor, the source thereof is grounded, and the gate thereof is coupled to the drain of the fifth PMOS transistor, thereby outputting the comparison signal from the drain of the seventh NMOS transistor.

11. The RC oscillator according to claim 9, wherein,
the capacitor charging/discharging module comprises:
the capacitor and a second capacitor,
a first switch coupled in parallel with the capacitor and a second switch coupled between the capacitor and the drain of the fifth PMOS transistor, and
a third switch coupled in parallel with the second capacitor and a fourth switch coupled between the second capacitor and the drain of the fifth PMOS transistor,
wherein the first to fourth switches are respectively controlled by the clock signal or its inverted signal, such that the second switch and the third switch are turned on when the first switch and the fourth switch are turned off, and the first switch and the fourth switch are turned on when the second switch and the third switch are turned off.

12. The RC oscillator according to claim 9, wherein,
the clock signal generating module comprises:
an inverter, for inverting the comparison signal, and
a D flip-flop, whose data input terminal is coupled to its inverting output terminal, whose clock input terminal is coupled to an output terminal of the inverter, and whose output terminals respectively output the clock signal and its inverted signal.

13. The RC oscillator according to claim 8, wherein,
the comparison module comprises:
a first comparator and a second comparator, wherein both the first comparator and the second comparator use the total bias current as a bias current, such that flipping voltages of the first comparator and the second comparator are equal to the gate-source voltage of the fourth NMOS transistor.

14. The RC oscillator according to claim 13, wherein, the first comparator includes:
a sixth PMOS transistor, for forming a fifth current mirror with a transistor in the third PMOS current mirror, and outputting the total bias current, and
a seventh NMOS transistor matched with the fourth NMOS transistor, wherein the drain of the seventh NMOS transistor is coupled to the drain of the sixth PMOS transistor, the source thereof is grounded, and the gate thereof is coupled to the charging voltage on the capacitor, thereby outputting a first comparison signal from the drain of the seventh NMOS transistor, and
wherein the second comparator includes:
an eighth PMOS transistor, for forming a sixth current mirror with a transistor in the third PMOS current mirror, and outputting the total bias current, and
a ninth NMOS transistor matched with the fourth NMOS transistor, wherein the drain of the ninth NMOS transistor is coupled to the drain of the eighth PMOS transistor, the source thereof is grounded, and the gate thereof is coupled to the charging voltage on a second capacitor, thereby outputting a second comparison signal from the drain of the ninth NMOS transistor.

15. The RC oscillator according to claim 13, wherein, the capacitor charging/discharging module comprises:
the capacitor and a second capacitor,
a first switch coupled in parallel with the first capacitor and a second switch coupled between the capacitor and the drain of the fifth PMOS transistor, and
a third switch coupled in parallel with the second capacitor and a fourth switch coupled between the second capacitor and the drain of the fifth PMOS transistor,
wherein the first to fourth switches are respectively controlled by the clock signal or its inverted signal, such that the second switch and the third switch are turned on when the first switch and the fourth switch are turned off, and the first switch and the fourth switch are turned on when the second switch and the third switch are turned off.

16. The RC oscillator according to claim 14, wherein, the clock signal generating module comprises:
a first inverter and a second inverter, for respectively inverting the first comparison signal and the second comparison signal, and
a RS flip-flop, whose input terminals are respectively coupled to the output terminals of the first inverter and the second inverter, and which outputs the clock signal and its inverted signal.

17. The RC oscillator according to claim 1, wherein the resistance values of the first bias resistor and the second bias resistor do not vary with temperature.

* * * * *